United States Patent [19]
Harada et al.

[11] Patent Number: 5,643,834
[45] Date of Patent: Jul. 1, 1997

[54] PROCESS FOR MANUFACTURING A SEMICONDUCTOR SUBSTRATE COMPRISING LAMINATED COPPER, SILICON OXIDE AND SILICON NITRIDE LAYERS

[75] Inventors: Keizo Harada; Takao Maeda; Takatoshi Takikawa; Shunsuke Ban; Shosaku Yamanaka, all of Itami, Japan

[73] Assignee: Sumitomo Electric Industries, Ltd., Osaka, Japan

[21] Appl. No.: 450,406

[22] Filed: May 25, 1995

Related U.S. Application Data

[62] Division of Ser. No. 907,229, Jul. 1, 1992, Pat. No. 5,455,453.

[30] Foreign Application Priority Data

| Jul. 1, 1991 | [JP] | Japan | 3-160678 |
| Jan. 27, 1992 | [JP] | Japan | 4-12228 |
| Mar. 5, 1992 | [JP] | Japan | 4-48602 |
| Apr. 20, 1992 | [JP] | Japan | 4-99837 |

[51] Int. Cl.⁶ ............ H01L 21/48; H01L 21/56; H01L 21/58; H01L 21/60
[52] U.S. Cl. ............ 437/210; 437/211; 437/238; 437/241; 437/245
[58] Field of Search ............ 437/210, 211, 437/215, 219, 238, 241, 243, 245, 937, 946, 978

[56] References Cited

U.S. PATENT DOCUMENTS

| 3,925,804 | 12/1975 | Cricchi et al. | 357/23 |
| 4,104,697 | 8/1978 | Kendall et al. | 361/305 |
| 4,151,543 | 4/1979 | Hayakawa et al. | 257/739 |
| 4,172,261 | 10/1979 | Tsuzuki et al. | 357/81 |
| 4,561,010 | 12/1985 | Ogihara et al. | 357/74 |
| 4,639,760 | 1/1987 | Granberg et al. | 357/75 |
| 4,686,559 | 8/1987 | Haskell | 257/640 |
| 4,717,681 | 1/1988 | Curran | 437/31 |
| 4,873,559 | 10/1989 | Shimizu et al. | 357/23.6 |
| 4,947,234 | 8/1990 | Einsinger et al. | 357/68 |
| 5,103,283 | 4/1992 | Hite | 357/51 |
| 5,164,339 | 11/1992 | Gimdelson | 437/235 |
| 5,244,839 | 9/1993 | Baker et al. | 437/209 |

FOREIGN PATENT DOCUMENTS

| 0113088 | 7/1984 | European Pat. Off. |
| 2 150 695 | 4/1973 | Germany . |
| 63-186454 | 8/1980 | Japan . |
| 55-128852 | 10/1980 | Japan . |
| 59-219949 | 11/1984 | Japan . |
| 62-179750 | 6/1987 | Japan . |
| 1 189 153 | 7/1989 | Japan . |
| 2 063 148 | 3/1990 | Japan . |
| 3-029348 | 2/1991 | Japan . |
| 5-021668 | 1/1993 | Japan . |

*Primary Examiner*—David E. Graybill
*Attorney, Agent, or Firm*—Wenderoth, Lind & Ponack

[57] ABSTRACT

A process for manufacturing a plastic package type semiconductor device composed of a rolled metal substrate made of copper or copper alloy and an insulating film formed on the surface of the substrate. The film may be a single-layer film made of silicon oxynitride or a composite film formed by laminating a silicon oxide layer and a silicon oxynitride layer (or a silicon nitride layer). A semiconductor element is mounted on the film or on the exposed surface of the substrate. Other passive elements are provided on the film. After connecting these elements with bonding wires, the entire device is sealed in a resin molding. This device is thus free of cracks due to difference in thermal expansion between the film and the substrate, or peeling due to moisture absorption.

6 Claims, 2 Drawing Sheets

PROCESS FOR MANUFACTURING A SEMICONDUCTOR SUBSTRATE COMPRISING LAMINATED COPPER, SILICON OXIDE AND SILICON NITRIDE LAYERS

This is a divisional application of Ser. No. 07/907,229, filed Jul. 1, 1992, U.S. Pat. No. 5,455,543.

This invention relates to a semiconductor device having electric elements such as semiconductor elements mounted thereon and a method for manufacturing the same.

There are many kinds of semiconductor devices which have functional elements such as semiconductor elements, signal and/or power wirings, and passive elements such as resistors and capacitors. Such devices include hybrid ICs and various IC packages. One of such devices comprises what is called a plastic package which can be made by automation by use of lead frame and resin sealing and a board in the form of an alumina substrate having Ag—Pd wirings formed thereon by screen printing, a laminated ceramics board having multi-layered wirings or a printed wiring board being mounted in the plastic package. Such a device can accommodate a plurality of elements therein. Japanese Unexamined Patent Publication 62-185549 discloses a plastic package which has resistors and film wiring layers formed on an insulating film formed on die pads of a lead frame made of FeNi alloy to increase density.

Recent electronic parts such as semiconductor packages are becoming more densely integrated, lighter, thinner, shorter and smaller and less expensive. But with this tendency a semiconductor element tends to heat up easily. Thus, a semiconductor package having a high heat is dissipation required. Demands for plastic packages are especially high because they are mass-productive and less costly.

But the aforementioned plastic package having an alumina wiring board built therein has a problem that it is difficult to produce thin and fine wirings. With plastic packages containing a printed wiring board, besides the difficulty in fining the wirings and the softening of adhesives when mounting the element, especially during wire bonding, its low long-term reliability was the problem. Further, the technique disclosed in Japanese Unexamined Patent Publication 62-185349 for achieving high density is not adapted for mass-production because it is difficult to form insulating films having high insulating properties on metals with high yield.

The prior art packages had the problem of poor heat dissipation and thus could not meet the requirement for higher speed and higher density.

In view of these problems, we conceived of forming an insulating film on the surface of a rolled substrate made of copper or copper alloy (containing 50 wt % or less of non-copper elements), which is gaining popularity as a lead frame material these days, mounting functional elements on the insulating film or the exposed surface of the substrate, and further providing film wirings as relays to external leads and noise-removing film resistors and film capacitors on the insulating film. In this case, the insulating film is made of an inorganic material and is provided without using any adhesive. Copper or copper alloy has a high heat dissipating capacity and has a thermal expansion coefficient similar to that of the molded resin. Thus, resin can be molded stably. But if the insulating film is a laminated film which is laminated using an adhesive, not only will the heat dissipating capacity drop, there will also arise problems such as decreased heat resistance and difficult thinning of the package. Use of a resin film and/or inorganic adhesive can aggravate the long-term reliability of the package as well.

On the other hand, if an inorganic insulating film is provided directly on the substrate of copper or copper alloy, the following problems will arise:

1) While the thermal expansion coefficient of such a substrate is $17\times10^{-6}$, the thermal expansion coefficient of an inorganic insulating film is typically $10\times10^{-6}$. The difference is rather great. On the other hand, the film forming temperature during the film forming step has to be kept high for better adhesion and reactivity. When the film formed is cooled thereafter, it is subjected to an excessive stress due to the difference in the thermal expansion coefficient. Due to this stress, the film may sustain cracks or its moisture absorption speed may be accelerated, worsening the resistance to moisture.

2) Copper and copper alloy surfaces oxidize easily and a very brittle oxide film forms. Thus, water taken by moisture absorption into the interface between the insulating film and the board will oxidize the surface of the board and the resulting oxide layer will be broken and peel off the insulating layer under the stress which acts on the insulating film.

3) The surface of the rolled metal sheet is rather rough, i.e. Rmax=0.2 micron or more. It is difficult to cover the surface with a thin film and thus provide sufficient insulation.

An object of the present invention is to provide a cost-effective plastic package type semiconductor device which has a good heat dissipating capacity and which permits high integration by eliminating the above problems 1)–3), which impair insulation of the insulating film on the board and long-term reliability.

In accordance with the present invention, there is provided a semiconductor device comprising a rolled metal substrate made of copper or a copper alloy composed of copper as a matrix and at least one other element in an amount of 50 wt% or less, an insulating film provided on a surface of the metal substrate and having a thickness of from 1 micron to 20 microns inclusive, a semiconductor element mounted on the insulating film or on the exposed surface of the metal substrate, and signal and/or power film wirings, and passive elements such as a film resistor or a film capacitor, mounted on the insulating film, the insulating film being a single-layer film made of a mixture of silicon oxide and silicon nitride or a multi-layered film having two or more layers laminated one on another and comprising a silicon oxide layer and a layer made of a mixture of silicon oxide and silicon nitride or a silicon nitride layer.

The metal board used in the present invention should preferably have a surface roughness Rmax of not less than 0.1 micron. This surface roughness may be obtained while rolling the material or by grinding the board surface mechanically or electrically after rolling. It is also preferable to form, on the surface of the metal board, a single-layered metal film made of one selected from Ni, Cr, Al, Ti, Au, Pt and Ag or a laminated film or an alloy film made of two or more of the above elements. The film thickesses of these metal films should be preferably 0.1 to 10 microns.

The signal or power film wirings formed on the insulating film (or on the substrate) by sputtering, vacuum deposition or ion plating have a three-layer structure comprising e.g. an aluminum film as a conductive layer, a nickel layer formed thereon as a layer for preventing diffusion, and an uppermost gold layer on which are performed wire bondings. To form a microscopic wiring pattern, the metal mask patterning or photolithographic technique may be used. By forming such filmy wirings, high integration with fine patterns becomes possible. Further, since the metal substrate and the film wirings are separated from each other by the insulating film, the latter acts as a bypass capacitor which serves to keep the noise low.

Film resistors having a desired resistivity may be formed from a film resistor material such as NiCr, TaN, TiN or CrSiO by sputtering, vacuum deposition or ion plating. For fine adjustment of the resistivity, laser trimming may be used. The film capacitors may be formed from $Ta_2O_5$ by sputtering, vacuum deposition or ion plating. Also, as described above, the insulating film between the board and the film wirings may be used as a capacitor. These passive elements such as resistors and capacitors serve to dampen signal ringings which can pose a problem when transmitting high-speed signals. This permits speedups of operation of the semiconductor package.

The insulating film of silicon compound may be any one selected from (1) a single-layered silicon oxynitride film containing nitrogen preferably in the atomic ratio to Si of 0.3 to 0.8, (2) a composite film made up of two or more layers including silicon oxide layer and silicon oxynitride or silicon nitride layer containing nitrogen preferably in the atomic ratio to Si of 0.3 or more, and (3) a composite film formed of two or more layers including silicon oxide layer and silicon oxynitride layer, its nitrogen content increasing or decreasing continuously in the direction of thickness of the film so that the maximum nitrogen content is 0.3 or more in the atomic ratio to Si.

Throughout the specification and the claims, the term "silicon oxynitride" is used to mean "a mixture of a silicon oxide compound and a silicon nitride compound"

Preferably, the silicon oxynitride layers, silicon oxide layers and silicon nitride layers should have as a intrinsic stress of the film a compressive stress or a tensile stress of $8 \times 10^9$ (dyn/cm$^2$) and more preferably have a compressive stress of $8 \times 10^9$ (dyn/cm$^2$) or less or a tensile stress of $3 \times 10^9$ (dyn/cm$^2$) or less. The intrinsic stress of the film herein referred to represents a value obtained by subtracting the thermal stress resulting from the difference in thermal expansion coefficient between the board and the film from the total residual stress of the film formed on the board. The total residual stress can be measured in several ways. For example, as a destructive test, the stress can be calculated from the warpage of the film peeled off the substrate. As a non-destructive test, the stress can be calculated from the warpage of the board carrying the film.

Any of the abovesaid insulating films (1)–(3) contains hydrogen. The single-layered film (1) contains combined hydrogen preferably in an amount which satisfies at least one of the following formula (1) and (2) at the absorption peak of infrared absorption spectrum:

$$0.001 \leq I11/IM1 \leq 0.3 \tag{1}$$

$$0.01 \leq I21/IM1 \leq 1.5 \tag{2}$$

wherein,

IM1=max (IO1, IN1), greater one of IO1 and IN1:

I11: maximum absorption height by Si—H bond in a wave number range of 2150–2350 cm$^{-1}$ I21: maximum absorption height by Si—OH bond in a wave number range of 860–980 cm$^{-1}$ 1IO1: maximum absorption height by Si—O bond in a wave number range of 1020–1200 cm$^{-1}$ IN1: maximum absorption height by Si—N bond in a wave number range of 840–920 cm$^{-1}$ The composite insulating film (2) should contain, in the silicon compound in each layer, combined hydrogen preferably in an amount which satisfies at least one of the following formula (3) and (4) at the absorption peak of infrared absorption spectrum:

$$0.001 \leq I12/IM2 \leq 0.3 \tag{3}$$

$$0.01 \leq I22/IM2 \leq 1.5 \tag{4}$$

wherein,

IM2=max (IO2, IN2), greater one of IO2 and IN2:

I12: maximum absorption height by Si—H bond in a wave number range of 2150–2350 cm$^{-1}$ I22: maximum absorption height by Si—OH bond in a wave number range of 860–980 cm$^{-1}$ IO2: maximum absorption height by Si—O bond in a wave number range of 1020–1200 cm$^{-1}$ IN2: maximum absorption height by Si—N bond in a wave number range of 840–920 cm$^{-1}$ The composite film (3) should contain, in the silicon compound in each layer, combined hydrogen preferably in an amount which satisfies at least one of the following (5) and (6) at the absorption peak of infrared absorption spectrum:

$$0.001 \leq I13/IM3 \leq 0.3 \tag{5}$$

$$0.01 \leq I23/IM3 \leq 1.5 \tag{6}$$

wherein,

IM3=max (IO3, IN3), greater one of IO3 and IN3:

I13: maximum absorption height by Si—H bond in a wave number range of 2150–2350 cm$^{-}$ I23: maximum absorption height by Si—OH bond in a wave number range of 860–980 cm$^{-1}$ IO3: maximum absorption height by Si—O bond in a wave number range of 1020–1200 cm$^{-1}$ IN3: maximum absorption height by Si—N bond in a wave number range of 840–920 cm$^{-}$ Further, the insulating film may contain one element or two or more elements selected from a group consisting of F, C, B, S, P, Al, So, As, Go, Ga, Zn, To, Sb, Sn and In in the amount of 10% of less in terms of the atomic ratio to Si. Also, the insulating film may have at a superficial layer and/or a lowermost layer moisture-resistant protective films made of non-conductive carbon, SiC, $Al_2O_3$, $Zr_2O$, A N, Bn or a combination thereof.

In order to form such an insulating film on the board evenly with good adhesion, according to the present invention, oxides on the surface of the metal board is firstly removed by plasma cleaning in the atmosphere of Ar gas, $H_2$ gas or a mixture thereof, under the following conditions: board temperature: 350 or less, atmospheric gas pressure: 0.1–30 Torr, discharge output: 0.1–10 W/cm$^2$, discharge time: one minute or more. An insulating film is then formed on the board by vapor phase development with the plasma CVD (P-CVD) or the CVD technique, using an Si source gas, a nitrogen source gas and an oxygen source gas as materials, under the following conditions: board temperature: 350° C. or less, gas pressure when forming film: 0.1 Torr or more and not more than the atmospheric pressure, flow ratio of nitrogen and oxygen source gases to Si source gas: 0.5–30, preferably 0.5–10. The Si source gas may be Sin $H_{2n+2}$ (n=1, 2, 3, 4), Si $(C_2H_5O)_4$, or other organic Si gases. The N source gas may be $N_2$ or $NH_3$. The O source gas may be $O_2$, $O_3$, $N_2O$, NO, $NO_2$ or a mixture thereof.

As another method, after removing oxide layers on the surface of the metal board by electrochemical treatment, the insulating film may be formed on the metal board with the plasma CVD technique, using $SinH_{2n+2}$ (n=1, 2, 3, 4) or $Si(C_2H_5O)$ as an Si source gas, $NH_3$ or $N_2$ as an N source gas, and one or more gases selected from $N_2O$, $NO$, $NO_2$, $O_2$ and $O_3$ as oxygen source gas, under the following conditions: metal board temperature: 350° C. or less, preferably 200°–550° C., gas pressure at plasma discharge for pretreatment: 0.1–30 Torr, preferably 0.5–30 Torr, applied high-frequency output: 0.1–10 w/cm$^2$, preferably 0.5–10 w/cm$^2$, discharge time: one minute or longer, preferably five minute or longer, gas pressure when forming film: 0.1–5 Torr, gas flow ratio: $Fs/(Fn+Fo) \leq 2$, preferably $0.1 \leq Fs/(Fn+Fo) \leq 2$, (wherein Fs is a gas flow rate of Si source gas, Fn is a gas flow rate of N source gas and Fo is a gas flow rate of O source gas), high-frequency output density; 0.1–2.0 w/cm$^2$, distance between the board and electrodes: 10–40 mm, preferably 20–40 mm, and board temperature: 350° C. or lower, preferably 200°–550° C.

Insulating films according to the present invention can be formed with other methods such as high-frequency magnetron sputtering, laser deposition, ion plating, vacuum deposition, ECR plasma CVD, laser CVD or optical CVD.

A silicon oxide film has a good strength as a material and has small Young's modulus and Poisson's ratio, which can increase stresses. Thus, cracks hardly develop but it readily absorbs moisture. On the other hand, unlike silicon oxide, silicon nitride is known to scarcely absorb moisture though cracks develop easily.

The silicon oxynitride film used in the present invention has both the advantages of the above two materials. That is, cracks hardly develop and moisture absorption, which is the cause of deterioration and peeling of the film, hardly occur. This is also true of the film formed by laminating a silicon oxide layer and a silicon oxynitride layer or a silicon nitride layer.

The present inventors studied the mechanism on how cracks develop and have discovered that in most cases, cracks develop on the silicon compound insulating film provided on the copper or copper alloy board if the film is subjected to tensile stress and more particularly such cracks develop only if the intrinsic stress during the film forming step is an excessive tensile stress. We studied the relation between the intrinsic stress and crack formation for silicon oxide, silicon oxynitride and silicon nitride films having a thickness of 20 microns or less. No cracks were observed if the tensile stress as the intrinsic stress was $8 \times 10^9$ dyn/cm$^2$ or less or the intrinsic stress was a compressive stress. From this fact, we have found that crack formation can be avoided if the intrinsic stress during the film forming step is a small tensile stress or a compressive stress.

In a temperature cycle test, one of the reliability tests of a semiconductor device, stress change on the film is applied repeatedly. In such a condition, cracks develop more readily. We discovered that in order for the film to withstand such a repeated fatigue test, it is necessary to control the compressive stress to $8 \times 10^9$ dyn/cm$^2$ or less or the tensile stress to $3 \times 10^9$ dyn/cm$^2$ or less.

As a result of further studies and experiments, we also found that by controlling the amount of hydrogen contained in the film, the intrinsic stress during the film forming step can be a small tensile or compressive force. By measuring and controlling the amount of combined hydrogen by infrared absorption spectrum, the intrinsic stress can be controlled in such a manner that cracks will not develop on the film. Based on these findings, we succeeded in establishing the method of determining whether the film may develop cracks or not.

Now we shall describe what influences the hydrogen contained in the film have on the stress of the film.

As is well-known, a silicon oxide film or a silicon oxynitride film formed with a vapor phase technique such as the CVD or P-CVD technique has an amorphous structure having no long-distance order as a crystal lattice. But it is crystalline if one see a short-distance order, i.e. one unit cell at minimum. For example, each cell of a silicon oxide film comprises Si and O and maintains the shape of a substantially right tetrahedron. But the adjacent cells are bonded together in a disturbed manner due to dangling bonds or the bonds between redundant atoms. If there exist bonding hands other than the Si—O or Si—N bonds or dangling bonds, such portions will be locally subjected to strain. As a result, the entire film is subjected to stress. Taking these phenomena into due consideration, the present inventors studied in detail the relation between the content of the hydrogen atoms as redundant atoms in the film and the internal stress of the film. As a result, we found the optimum range of the ratio of the absorption peak by the Si—H bond or Si—OH bond to the absorption peak by the Si—O or Si—N bond to keep the intrinsic stress to a difficult-to-crack value, which is represented by the above-listed relational expressions 1–6.

As described above, since the content of hydrogen in the film can be controlled by measuring the amount of bound hydrogen by the infrared absorption spectrum, the film can be protected reliably against excessive stress during the film forming step. The insulating film thus obtained is free of cracks and of high quality.

For similar reasons, one or more elements selected from F, C, B, S, P, Al, So, As, Ge, Ga, Zn, Te, Sb, Sn and In may be added in addition to hydrogen, in an amount of 10% or less in terms of the ratio to Si atoms.

A single-layered film made of one of Ni, Cr, Al, Ti, Au, Pt and Ag or a laminated film or alloy film made of two or more of the above said metals may be formed beforehand on the metal substrate as a protective layer, which serves to prevent the formation of a brittle oxide layer on the substrate of copper or copper alloy. Even if there are parts on the metal substrate where the insulating film is not formed, the metal film serves to prevent deterioration by moisture absorption at the exposed part between the metal substrate and the edge of the insulating film. If its film thickness is 0.1 micron or less, the film cannot cover the substrate sufficiently and thus is not effective. On the other hand, if the film thickness is 10 microns or more, the film forming cost will be too high to be practical. Also, the adhesion of such a film to the substrate is so weak that it can peel off easily.

Now, we shall discuss in detail the conditions and effects in the method for forming a high-performance insulating film made of a silicon compound on a substrate made of a rolled metal and having a rough surface with the plasma CVD or CVD technique.

By heating the substrate and removing any oxides on the surface layer by plasma discharge in the atmosphere of Ar gas, $H_2$ gas or their mixture, the surface of the substrate is cleaned and the adhesion of the film improves. The substrate temperature in this step should be 350° C. or less. Otherwise, the heating temperature will exceed the softening temperature of the copper and copper alloy contained in the substrate. In order to clean the substrate surface sufficiently, the plasma discharge time should be one minute or longer, though this is also dependent upon the gas pressure and applied output.

As material gases for forming an insulating film of silicon compound containing oxygen and nitrogen, Si source gases, N source gases and O source gases as described above are used. The content of hydrogen in the film can be controlled by adjusting the flow ratio of these gases or by adding hydrogen gas as a reaction gas.

The gas pressure when forming the film should be 0.1 Torr or more and not more than the atmospheric pressure. If less than 0.1 Torr, the film forming rate is too small to be practical. Further, since the film cannot be formed with good covering rate on a rolled metal substrate having a rough (Rmax≧0.1 micron) surface, the insulating property of the films is no good. This is because the gas average free path depends on the degree of ambient vacuum and the lower the gas pressure, the longer the average free path and thus the lower the throwing power of the film to the substrate.

The contents of oxygen and nitrogen in the film may be adjusted by adjusting the flow ratio of source gases. It was necessary to set the upper limit for the gas flow ratio Fs/(Fn+Fo) to avoid insufficient specific resistance of the film resulting from insufficient content of oxygen and nitrogen in the film and to avoid the content of hydrogen in an excessive amount. On the other hand, the lower limit was provided to prevent the development of cracks while forming the film due to shortage of hydrogen in the film.

The film thickness of the insulating film is restricted to 1–20 microns because if less than 1 micron, even if the film covers the substrate surface with high throwing power, the insulation yield would be bad on a rolled metal plate having a rough surface. If more than 20 microns, not only will the cost too high, but such a film can develop cracks easily. The film thickness should preferably be 3 to 10 microns inclusive.

According to the present invention, an insulating film having good insulating properties as well as high resistance to cracks, moisture and peeling is formed on a rolled metal substrate made of copper or copper alloy. On this film, film wirings and passive elements for removing noise are provided. Further, active elements are mounted on the insulating film or on the exposed surface of the substrate. Thus, this construction in a plastic package form contributes to improved heat dissipation, finer wirings and further thinning of the device. Such a device satisfies the requirements for high-scale integration, higher performance, more compact size and improved productivity, and lower cost.

Other features and objects of the present invention will become apparent from the following description taken with reference to the accompanying drawings, in which.

Now detailed description will be made of the present invention with reference to the embodiment of FIGS. 1 and 2. The following embodiment represents an essence of a part of the present invention and is a mere example. It is not intended to restrict the present invention.

Figure 1:
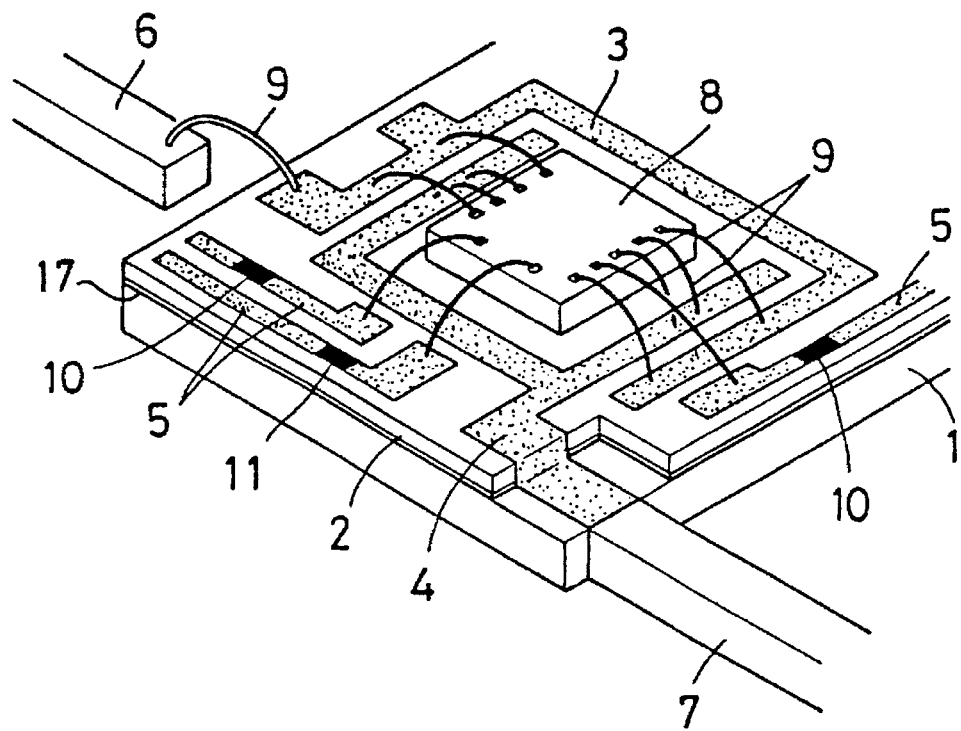
FIG. 1 is a perspective view showing one example of the internal structure of the semiconductor device according to the present invention.
Figure 2:
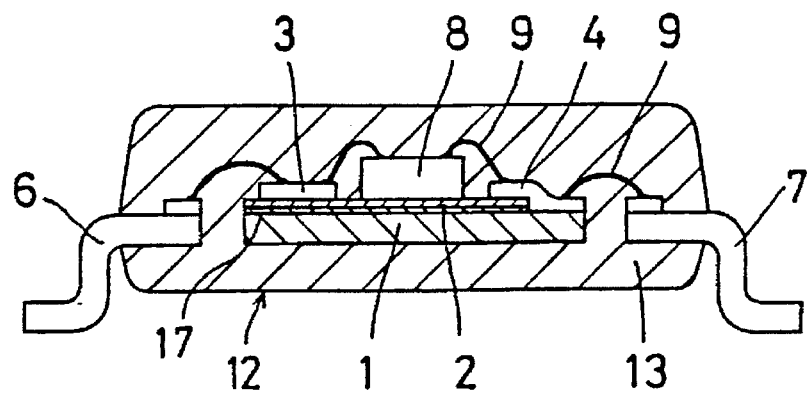
FIG. 2 is a sectional view showing schematically the entire structure of the semiconductor device according to the present invention.

In FIGS. 1 and 2, the device comprises a metal substrate 1 made of copper or copper alloy rolled material, an insulating film 2 formed directly on the surface of substrate 1; Vcc wirings 3 formed on the film 2; a GND wiring 4 also formed on the film 2; and signal (I/O) wirings 5 formed on the film 2. The insulating film 2 is cut out partially to connect one end of the GND wiring 4 to the metal substrate 1 at this cut-out portion. Numeral 6 designates a Vcc external lead and 7 is a GND external lead. The wirings 5, 4 and 5 are all film wirings.

A semiconductor element 8 mounted on the insulating film 2 has its power electrodes connected to the Vcc wiring 3 through bonding wires 9. The Vcc wiring 3 is connected to the external lead 6 through a bonding wire 9. The GND wiring 4 is connected to the GND external lead 7. On the other hand, the signal electrodes of the semiconductor element 8 are connected eventually to a signal external lead (not shown) similar to the leads 6 and 7. If as shown in the figure the signal wirings 5 are provided, at least some of the signal electrodes have to be connected to the external lead through the wirings 5.

With this arrangement, since the portions between 1 and 3 and between 5 and 3 are insulated by the insulating film 2, 1 and 3 serve as electrodes, thus forming a by pass capacitor over the entire Vcc wiring 3. This prevents noise infiltration during element switchings to the semiconductor element 8.

It may be sometimes necessary to provide passive elements in the signal wirings 5, such as film resistors 10 formed of NiCr, TaN, TiN or CrsiO by sputtering, vacuum-depositing or ion-plating or film capacitors formed by treating $Ta_2O_4$ in a similar manner. Numeral 12 in FIG. 2 generally shows the finished semiconductor element (plastic flat package) according to the present invention, showing the state after having been sealed in a plastic body 13.

The insulating film 2 is a single-layer film made of silicon oxynitride, a composite film formed by laminating two or more layers made of silicon oxide and silicon oxynitride or silicon nitride, or a composite film formed by laminating two or more layers, silicon nitride layer and silicon oxynitride layer containing nitrogen so that its content changes in the direction of film thickness. The nitrogen content in terms of atomic ratio with respect to Si is preferably set within the abovementioned range. The infrared absorption peak ratio of the hydrogen content is preferably set within the range which satisfies the aforementioned formed. The film thickness should be within the range of 1–20 microns for the abovementioned reasons.

Such a film can be made by use of an organic Si source gas such as $SinH_{2n+2}$ (n=1, 2, 3, 4 . . . ) or TEOS {Si $(C_2H_5O)_4$}, an N source gas selected from $NH_3$ and $N_2$, and one or more kind of O source gas (composite gas) selected from $N_2O$, $NO$, $NO_2$, $O_2$ and $O_3$ with one of the above-described film-forming methods including the method according to the present invention.

Figure 3A:
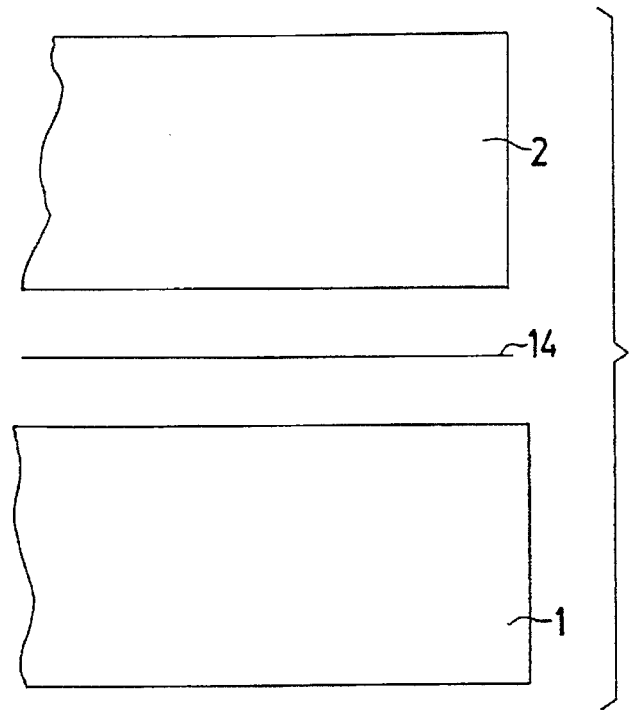
FIGS. 3A and 3B are exploded schematic views of the structure according to claim 1 depicting the cases wherein a single (3A) or multi-layered film (3B) are interposed between the substrate and the insulating film.
Figure 3B:
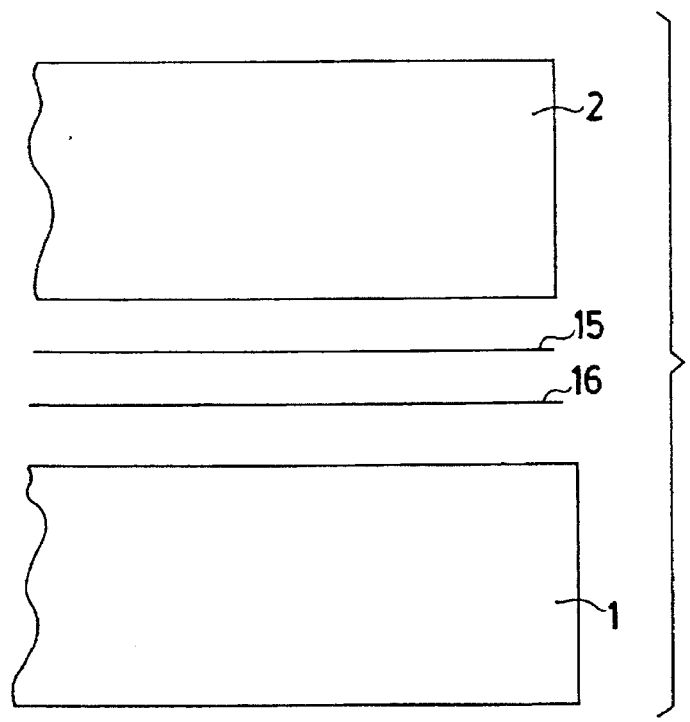

In FIGS. 3A and 3B there are illustrated the cases wherein a single layer (3A) or multiple layers 15, 16 (3B) are interposed between the substrate and the insulation layer.

Now, we shall describe the specific embodiments of the present invention.

(Experiment 1)

We mounted as the semiconductor element 8 a CMOS digital logic IC on the substrate 1 as described with reference to FIG. 1 to form a surface-mount type, resin-sealed, 132-pin plastic flat package (PQFP) 12, shown in FIG. 2. The package has a 24×24×4 mm plastic body 13. Thirty three external lead pins are provided on each side with pin pitches being 0.64 mm. The Vcc wiring 3 in FIGS. 1 and 2 has an area of 40 mm$^2$, which is necessary for easy and smooth wiring work with bonding wires 9. This wiring area serves as the electrode area of the bypass capacitor formed between the wirings and the substrate with the insulating film 2 as a dielectric.

We measured the heat resistance of this package. It was 22 C/W, which was fairly low as a plastic package.

Also, even if the number of simultaneous switchings of the CMOS digital logic IC thus mounted is increased, no particularly problematic signal noise waveforms appeared, which clearly shows that the semiconductor device is sufficiently adaptable to high-speed operation.

(Experiment 2)

In order to test the long-term reliability of the plastic package, the device was mounted in the same package as used in Experiment 1 and put to a temperature cycle test and a moisture resistance test (PCT) under the following conditions.

Temperature cycle test . . . −55° C./150° C. 1000 cycles

Moisture resistance test . . . 121° C. 2 atm. 1000 hours

We took out samples once every 100 cycles for the temperature cycle test and once every 100 hours for the moisture resistance test and checked to see if there are any defects by checking their electrical properties.

For those samples which showed defects, their resin moldings were opened to examine inside. It turned out that the defects resulted from cracks in the insulating film or deterioration of the film by moisture absorption. Various kinds of insulation film samples having the structure according to the present invention and samples for comparison purposes were prepared. For each sample, we checked the number of cycles and the time at which defects appeared in a reliability evaluation test.

The insulating films were formed by the plasma CVD technique after plasma-cleaning the substrate surface.

Substrate: Cu alloy (Ni 3.2, Si 0.7, Zn 0.3 wt %)

Substrate temperature: 300° C.

Source Eases: $SiH_4$, $N_2O$, $NH_3$

Gas pressure: 0.5 Torr

High-frequency output: 0.3 $W/cm^2$

Film thickness: 4 microns

The adjustment of the nitrogen content was made by changing the flow ratio of the source gases. The N content was measured with an ESCA. It was confirmed that the film contained a trace amount of hydrogen.

Table 1 shows the test results on the single-layer silicon oxide films and silicon oxynitride films as insulating films.

Table 2 shows the structure of the composite films as insulating films formed by laminating silicon oxide layers and silicon oxynitride layers. Table 3 shows the test results thereof.

Also, we prepared films having the same structure and composition as shown in Table 2 except that the film material B (silicon oxynitride) has its nitrogen content increasing continuously in the direction of film thickness from the interface with the silicon oxide layer. They were put to a reliability evaluation test under the same conditions as shown in Table 2. The results are shown in Table 4. For the silicon oxynitride layers in which the nitrogen content changes continuously, the values in Table 2 represent the nitrogen contents at portions where the nitrogen content is maximum.

In such a test, the permissible number of temperature cycles and the permissible moisture resistance time vary depending upon the actual conditions of use. Ordinarily, the permissible levels are 300 cycles or over in the temperature cycle test and 300 hours or longer in the moisture resistance test.

In the above experiment, all the samples cleared the permissible levels, except for samples Nos. 1, 2, 3, 11, 17, 20, 23, 31, 37, 40 and 43, in which the nitrogen content or the atomic ratio of nitrogen to Si is smaller than 0.3, and sample No. 10, in which the above ratio is more than 0.9.

Thus, it was proved that they all have satisfactory long-term reliability as packages.

(Experiment 3)

In order to test the long-term reliability of the plastic package, the device was mounted in the same package as used in Experiment 1 and put to a temperature cycle test and a moisture resistance test (PCT) under the following conditions.

Temperature cycle test . . . −65° C./150° C. 1000 cycles

Moisture resistance test . . . 121° C., 2 atm. 1000 hours

We took out samples once every 100 cycles for the temperature cycle test and once every 100 hours for the moisture resistance test and checked to see if there are any defects by checking their electrical properties.

For those samples which showed defects, their resin moldings were opened to examine inside. It turned out that the defects resulted from cracks in the insulating film or deterioration of the film by moisture absorption. Various insulation film samples having the structure according to the present invention and comparative samples for comparison purposes were prepared. For each sample, we checked the number of cycles and the time at which defects appeared in a reliability evaluation test.

The insulating films were formed by plasma CVD after plasma-cleaning the substrate surface.

Substrate: Cu alloy (Ni 3.2, Si 0.7, Zn 0.3wt %)

Substrate temperature: 300° C.

Source gases: $SiH_4$, $N_2O$, $NH_3$

Gas pressure: 0.5 Torr

High-frequency output: 0.3 $W/cm^2$

Film thickness: 4 microns

The adjustment of the nitrogen and hydrogen contents was made by changing the flow ratio of the source gases. The nitrogen content was measured with an ESCA. The amount of hydrogen in the film was determined with the infrared absorption.

Table 5 shows the test results on the single-layer silicon oxynitride films as insulating films.

Table 6 shows the structure of the composite films as insulating films formed by laminating silicon oxide layers and silicon oxynitride layers. Table 7 shows the test results thereof.

Also, we prepared films having the same structure and composition as shown in Table 6 except that the film material B (silicon oxynitride) has its nitrogen content increasing continuously in the direction of film thickness from the interface with the silicon oxide layer (film material A). They were put to a reliability evaluation test under the same conditions as shown in Table 6. The results are shown in Table 8. For the silicon oxynitride layers in which the nitrogen content changes continuously, the values in FIG. 2 represent the nitrogen content at portion where the nitrogen content is maximum. As for I13/IM3, films having the same values as I12/IM2 in Table 6 were used. As for I23/IM3, films having the same values as I22/IM2 in Table 6 were used.

In this case, too, the permissible levels of the temperature cycles and the moisture resistance testing time are 500 cycles and 300 hours, respectively.

In the above experiment, all the samples cleared the 300-cycle and 300-hour lines, except sample Nos. 51, 52 and 60 in Table 5, Sample Nos, 61, 65, 68, 69 and 74 in Tables 6 and 7, Nos. 81, 85, 88, 89 and 94 in Table 8, of which the nitrogen content and the infrared absorption peak ratio for the bound hydrogen were out of the preferable range. Thus, it was proved that they all have satisfactory long-term reliability as packages. Sample No.56 in Table 5, Sample No. 67 in Tables 6 and 7, and Sample No. 87 in Table 8 showed good results in the temperature cycle and moisture resistance tests, despite the fact that the infrared absorption ratios were out of the preferable range. But since the dielectric properties of the insulating film were bad, which means that they failed to meet the requirements as ICs.

(Experiment 4)

Films made of silicon oxide, silicon nitride or a mixture thereof were formed on a copper alloy substrate with the parallel flat plate type P-CVD technique. We then examined the relation between the film-forming conditions and the film composition, intrinsic stress, insulating properties and cracks in the film.

The intrinsic stress was calculated from the warpage of the substrate measured with a stress analyzer. The intrinsic stress was obtained by subtracting the thermal stress from the measured value of the total stress. In order to evaluate the insulating properties, we formed 100 electrodes each 100 $mm^2$ in area on each insulating film and measured the insulating yield. As for the insulating performance, the films which showed a leak current of $1\times10^{-6}$ A or less at an applied voltage of 200 V were judged good.

Common film-forming conditions are shown below.

Preprocessing conditions: $H_2$ plasma etching, gas pressure=1 Torr, RF power density =0.3 $W/cm^2$ Substrate: Cu alloy (Ni 3.2, Si 0.7, Zn 0.3 wt %)

Material gas: $SiH_4+N_2O+NH_3$

Substrate temperature: 250° C.

Distance between substrate and electrodes: 30 mm

Film thickness: 5 microns

Other film-forming conditions and the test results are shown in Table 9. In the table, x and y show the oxygen and nitrogen contents, respectively, in terms of atomic ratios with respect to one Si atom. Other than Si, O and N, the film contains hydrogen and carbon in trace amounts but their quantitative values are not shown specifically.

As is apparent from Table 9, the sample Nos, 101, 104, 109, 110 and 119 show that favorable insulating films are obtainable from a silicon oxide, silicon nitride or a mixture thereof with the plasma CVD technique. In this example, we showed only $SiH_4+N_2O+NH_3$ as the material gas. But the silicon source may be TEOS and the nitrogen source may be $N_2$ and the oxygen source may be NO, $NO_2$, $O_2$ or $O_3$. In such cases, the influence of the forming conditions on the stress is similar to the results of Table 9.

TABLE 1

| Sample Nos. | N content in film (Atomic ratio to Si) | Result of temperature cycle test*1 | Result of moisture resistance test*2 |
|---|---|---|---|
| 1 | 0 | No cracks formed | 100 |
| 2 | 0.1 | " | 100 |
| 3 | 0.2 | " | 200 |
| 4 | 0.3 | " | 400 |
| 5 | 0.4 | 900 | 600 |
| 6 | 0.5 | 700 | 800 |
| 7 | 0.6 | 600 | No deterioration |
| 8 | 0.7 | 400 | " |
| 9 | 0.8 | 300 | " |
| 10 | 0.9 | 100 | " |

*1 Number of cycles at which cracks developed
*2 Time (in hour) at which deterioration by moisture occurred

TABLE 2

| | First layer | | | Second layer | | | Third layer | | |
|---|---|---|---|---|---|---|---|---|---|
| Sample Nos. | Film material | Film thickness (μm) | N content | Film material | Film thickness (μm) | N content | Film material | Film thickness (μm) | N content |
| 11 | A | 3.8 | 0 | B | 0.2 | 0.2 | — | — | — |
| 12 | A | 3.8 | 0 | B | 0.2 | 0.4 | — | — | — |
| 13 | A | 3.8 | 0 | B | 0.2 | 0.7 | — | — | — |
| 14 | A | 3.8 | 0 | B | 0.2 | 0.9 | — | — | — |
| 15 | A | 3.5 | 0 | B | 0.5 | 0.3 | — | — | — |
| 16 | A | 3.5 | 0 | B | 0.5 | 0.6 | — | — | — |
| 17 | A | 2 | 0 | B | 2 | 0.1 | — | — | — |
| 18 | A | 2 | 0 | B | 2 | 0.5 | — | — | — |
| 19 | A | 2 | 0 | B | 2 | 0.8 | — | — | — |
| 20 | A | 1 | 0 | B | 3 | 0.2 | — | — | — |
| 21 | A | 1 | 0 | B | 3 | 0.4 | — | — | — |
| 22 | A | 1 | 0 | B | 3 | 0.6 | — | — | — |
| 23 | A | 1 | 0 | B | 3 | 1.0 | — | — | — |
| 24 | B | 0.4 | 0.4 | A | 3.2 | 0 | B | 0.4 | 0.4 |
| 25 | B | 0.4 | 0.6 | A | 3.2 | 0 | B | 0.4 | 0.6 |
| 26 | B | 0.4 | 0.8 | A | 3.2 | 0 | B | 0.4 | 0.8 |
| 27 | B | 0.4 | 1.0 | A | 3.2 | 0 | B | 0.4 | 1.0 |
| 28 | B | 0.2 | 0.6 | A | 3.6 | 0 | B | 0.2 | 0.6 |
| 29 | B | 1.0 | 0.6 | A | 2 | 0 | B | 1.0 | 0.6 |
| 30 | B | 1.5 | 0.6 | A | 1 | 0 | B | 1.5 | 0.6 |

*Film material . . . A: silicon oxide, B: silicon oxynitride
*N content is expressed in terms of atomic ratio to Si
*First layer is formed on the substrate, followed by Second layer thereon and then Third layer

TABLE 3

| Sample Nos. | Result of temperature cycle test*1 | Result of moisture resistance test*2 |
|---|---|---|
| 11 | No cracks formed | 100 |
| 12 | " | 300 |
| 13 | " | 400 |
| 14 | " | 500 |
| 15 | " | 300 |
| 16 | " | 800 |
| 17 | " | 100 |
| 18 | " | 700 |
| 19 | 800 | No deterioration |
| 20 | 600 | 200 |
| 21 | No cracks formed | 600 |
| 22 | 900 | No deterioration |
| 23 | 100 | " |
| 24 | No cracks formed | 500 |
| 25 | " | No deterioration |
| 26 | " | " |
| 27 | 900 | " |
| 28 | No cracks formed | 800 |
| 29 | 700 | No deterioration |
| 30 | 900 | " |

*1 Number of cycles at which cracks developed
*2 Time (in hour) at which deterioration by moisture occurred

TABLE 4

| Sample Nos. | Film structure | Result of temperature cycle test*1 | Result of moisture resistance test*2 |
|---|---|---|---|
| 31 | Same as sample 11 | No cracks formed | 100 |
| 32 | Same as sample 12 | " | 300 |
| 33 | Same as sample 13 | " | 300 |
| 34 | Same as sample 14 | " | 400 |
| 35 | Same as sample 15 | " | 300 |
| 36 | Same as sample 16 | " | 600 |
| 37 | Same as sample 17 | " | 100 |
| 38 | Same as sample 18 | " | 500 |
| 39 | Same as sample 19 | 900 | No deterioration |
| 40 | Same as sample 20 | No cracks formed | 100 |
| 41 | Same as sample 21 | " | 400 |
| 42 | Same as sample 22 | " | No deterioration |
| 43 | Same as sample 23 | 100 | " |
| 44 | Same as sample 24 | No cracks formed | 400 |
| 45 | Same as sample 25 | " | No deterioration |
| 46 | Same as sample 26 | " | " |
| 47 | Same as sample 27 | 900 | " |
| 48 | Same as sample 28 | No cracks formed | 700 |
| 49 | Same as sample 29 | 800 | No deterioration |
| 50 | Same as sample 30 | No cracks formed | " |

*1 Number of cycles at which cracks developed
*2 Time (in hour) at which deterioration by moisture occurred

TABLE 5

| Sample Nos. | N content (Atomic ratio) | Infrared absorption peak ratio I11/IM1 | Infrared absorption peak ratio I21/IM1 | Result of temperature cycle test *1 | Result of moisture resistance test*2 |
|---|---|---|---|---|---|
| 51 | 0.2 | 0.001 | 0.008 | 500 | 100 |
| 52 | 0.2 | 0.01 | 0.2 | No cracks formed | 100 |
| 53 | 0.4 | 0.0007 | 0.006 | 300 | 700 |
| 54 | 0.4 | 0.002 | 0.03 | 600 | 600 |
| 55 | 0.4 | 0.1 | 0.5 | 900 | 400 |
| 56 | 0.4 | 0.45 | 1.8 | No cracks formed | 300 |
| 57 | 0.7 | 0.001 | 0.015 | 300 | No deterioration |
| 58 | 0.7 | 0.09 | 0.3 | 400 | " |
| 59 | 0.7 | 0.2 | 0.8 | 500 | 900 |
| 60 | 1.0 | 0.1 | 0.4 | 200 | No deterioration |

*1 Number of cycles at which cracks developed
*2 Time (in hour) at which deterioration by moisture occurred

TABLE 6

| Sample Nos. | First layer Film material | First layer Film thickness (μm) | First layer N content | Second layer Film material | Second layer Film thickness (μm) | Second layer N content | Third layer Film material | Third layer Film thickness (μm) | Third layer N content | Infrared absorption ratio I12/IM2 | Infrared absorption ratio I22/IM2 |
|---|---|---|---|---|---|---|---|---|---|---|---|
| 61 | A | 3.8 | 0 | B | 0.2 | 0.4 | — | — | — | 0.0001 | 0.002 |
| 62 | A | 3.8 | 0 | B | 0.2 | 0.4 | — | — | — | 0.07 | 0.3 |
| 63 | A | 3.5 | 0 | B | 0.5 | 0.4 | — | — | — | 0.04 | 0.1 |
| 64 | A | 3.5 | 0 | B | 0.5 | 0.3 | — | — | — | 0.1 | 0.6 |

TABLE 6-continued

| Sample Nos. | First layer | | | Second layer | | | Third layer | | | Infrared absorption ratio | |
|---|---|---|---|---|---|---|---|---|---|---|---|
| | Film material | Film thickness (μm) | N content | Film material | Film thickness (μm) | N content | Film material | Film thickness (μm) | N content | I12/IM2 | I22/IM2 |
| 65 | A | 3.5 | 0 | B | 0.5 | 0.3 | — | — | — | 0.0002 | 0.008 |
| 66 | A | 3.5 | 0 | B | 0.5 | 0.6 | — | — | — | 0.006 | 0.07 |
| 67 | A | 3.5 | 0 | B | 0.5 | 0.6 | — | — | — | 0.4 | 1.7 |
| 68 | A | 3.0 | 0 | B | 1.0 | 0.2 | — | — | — | 0.1 | 0.4 |
| 69 | A | 3.0 | 0 | B | 1.0 | 0.7 | — | — | — | 0.0008 | 0.009 |
| 70 | A | 3.0 | 0 | B | 1.0 | 0.7 | — | — | — | 0.007 | 0.02 |
| 71 | A | 3.0 | 0 | B | 1.0 | 0.7 | — | — | — | 0.09 | 0.4 |
| 72 | A | 2.0 | 0 | B | 2.0 | 0.5 | — | — | — | 0.08 | 0.2 |
| 73 | A | 2.0 | 0 | B | 2.0 | 1.0 | — | — | — | 0.07 | 0.1 |
| 74 | B | 0.4 | 0.6 | A | 3.2 | 0 | B | 0.4 | 0.6 | 0.0008 | 0.007 |
| 75 | B | 0.4 | 0.6 | A | 3.2 | 0 | B | 0.4 | 0.6 | 0.008 | 0.1 |
| 76 | B | 0.4 | 0.6 | A | 3.2 | 0 | B | 0.4 | 0.6 | 0.2 | 0.4 |
| 77 | B | 0.8 | 0.4 | A | 2.4 | 0 | B | 0.8 | 0.4 | 0.005 | 0.1 |
| 78 | B | 0.8 | 0.7 | A | 2.4 | 0 | B | 0.8 | 0.7 | 0.05 | 0.1 |
| 79 | B | 1.5 | 0.3 | A | 1.0 | 0 | B | 1.5 | 0.3 | 0.1 | 0.2 |
| 80 | B | 1.5 | 0.8 | A | 1.0 | 0 | B | 1.5 | 0.8 | 0.1 | 0.2 |

*Film material . . . A: silicon oxide, B: silicon oxynitride
*N content is expressed in terms of atomic ratio to Si
*First layer is formed on the substrate, followed by Second layer thereon and then Third layer

TABLE 7

| Sample Nos. | Result of temperature cycle test *1 | Result of moisture resistance test *2 |
|---|---|---|
| 61 | 200 | 300 |
| 62 | No cracks formed | 300 |
| 63 | 600 | 400 |
| 64 | No cracks formed | 300 |
| 65 | 200 | 500 |
| 66 | 600 | 800 |
| 67 | No cracks formed | 500 |
| 68 | " | 100 |
| 69 | 100 | No deterioration |
| 70 | 700 | " |
| 71 | No cracks formed | " |
| 72 | 800 | " |
| 73 | 300 | " |
| 74 | 100 | " |
| 75 | 500 | " |
| 76 | No cracks formed | " |
| 77 | 800 | 700 |
| 78 | 500 | No deterioration |
| 79 | No cracks formed | 500 |
| 80 | 500 | No deterioration |

*1 Number of cycles at which cracks developed
*2 Time (in hour) at which deterioration by moisture occurred

TABLE 8

| Sample Nos. | Result of temperature cycle test *1 | Result of moisture resistance test *2 |
|---|---|---|
| 81 | 100 | 300 |
| 82 | No cracks formed | 300 |
| 83 | 700 | 300 |
| 84 | No cracks formed | 300 |
| 85 | 200 | 400 |
| 86 | 600 | 600 |
| 87 | No cracks formed | 300 |
| 88 | " | 100 |
| 89 | 200 | 900 |
| 90 | 900 | 800 |
| 91 | No cracks formed | 700 |
| 92 | " | No deterioration |
| 93 | 400 | " |
| 94 | 100 | " |
| 95 | 500 | 900 |
| 96 | No cracks formed | No deterioration |
| 97 | " | 600 |
| 98 | 600 | No deterioration |
| 99 | No cracks formed | 400 |
| 100 | 500 | No deterioration |

*1 Number of cycles at which cracks developed
*2 Time (in hour) at which deterioration by moisture occurred

TABLE 9

| | Gas flow ratio | | | Gas pressure | RF power density | Film structure | | Intrinsic stress | | Crack | Insulation yield |
|---|---|---|---|---|---|---|---|---|---|---|---|
| Sample No. | SiH₄ | N₂O | NH₃ | (Torr) | (W/cm²) | X | Y | Direction | (dyn/cm²) | present? | (%) |
| 101 | 1 | | 0.2 | 1 | 0.5 | 0 | 0.6 | Tensile | $8.2 \times 10^9$ | Yes | 47 |
| 102 | 1 | | 5 | 1 | 0.5 | 0 | 1.2 | Tensile | $7.2 \times 10^9$ | No | 92 |
| 103 | 1 | | 10 | 1 | 0.5 | 0 | 1.4 | Tensile | $6.3 \times 10^9$ | No | 94 |
| 104 | 1 | | 10 | 0.1 | 0.5 | 0 | 1.3 | Tensile | $9.3 \times 10^9$ | Yes | 71 |
| 105 | 1 | | 10 | 0.5 | 0.5 | 0 | 1.3 | Tensikle | $7.3 \times 10^9$ | No | 96 |
| 106 | 1 | | 10 | 2 | 0.5 | 0 | 1.3 | Tensile | $6.8 \times 10^8$ | No | 98 |
| 107 | 1 | | 10 | 1 | 0.1 | 0 | 0.8 | Compressive | $1.1 \times 10^{10}$ | No | 52 |
| 108 | 1 | | 10 | 1 | 1 | 0 | 1.4 | Tensile | $7.2 \times 10^9$ | No | 99 |
| 109 | 1 | | 10 | 1 | 5 | 0 | 1.3 | Tensile | $9.7 \times 10^9$ | Yes | 71 |
| 110 | 1 | 0.2 | | 2 | 0.3 | 0.7 | 0 | Compressive | $7.1 \times 10^9$ | No | 46 |
| 111 | 1 | 3 | | 2 | 0.3 | 1.8 | 0 | Compressive | $3.4 \times 10^9$ | No | 96 |
| 112 | 1 | 10 | | 2 | 0.3 | 2.1 | 0 | Compressive | $9.2 \times 10^8$ | No | 98 |
| 113 | 1 | 10 | | 0.1 | 0.3 | 2.3 | 0 | Compressive | $4.3 \times 10^8$ | No | 99 |
| 114 | 1 | 10 | | 0.5 | 0.3 | 1.9 | 0 | Compressive | $5.1 \times 10^8$ | No | 97 |
| 115 | 1 | 10 | | 3 | 0.3 | 1.8 | 0 | Compressive | $3.7 \times 10^9$ | No | 100 |
| 116 | 1 | 10 | | 2 | 0.1 | 2 | 0 | Compressive | $9.4 \times 10^8$ | No | 98 |
| 117 | 1 | 10 | | 2 | 0.5 | 2.1 | 0 | Compressive | $8.7 \times 10^8$ | No | 99 |
| 118 | 1 | 10 | | 2 | 2 | 1.8 | 0 | Compressive | $6.7 \times 10^8$ | No | 96 |
| 119 | 1 | 0.2 | 0.2 | 1 | 0.5 | 0.8 | 0.3 | Compressive | $5.4 \times 10^9$ | No | 39 |
| 120 | 1 | 5 | 0.2 | 1 | 0.5 | 1.8 | 0.2 | Compressive | $8.1 \times 10^8$ | No | 97 |
| 121 | 1 | 10 | 0.2 | 1 | 0.5 | 1.9 | 0.1 | Compressive | $7.9 \times 10^8$ | No | 98 |
| 122 | 1 | 0.2 | 5 | 1 | 0.5 | 0.9 | 1.1 | Tensile | $7.8 \times 10^8$ | No | 96 |
| 123 | 1 | 0.2 | 10 | 1 | 0.5 | 0.8 | 1.2 | Tensile | $5.9 \times 10^8$ | No | 98 |
| 124 | 1 | 5 | 5 | 1 | 0.5 | 1.5 | 0.6 | Compressive | $4.8 \times 10^8$ | No | 99 |
| 125 | 1 | 10 | 10 | 1 | 0.5 | 1.4 | 0.6 | Compressive | $5.2 \times 10^8$ | No | 100 |

What is claimed is:

1. A method of manufacturing a semiconductor device comprising a rolled metal substrate made of metal selected from the group consisting of copper and a copper alloy composed of copper as a matrix and at least one other element in an amount of 50 wt % or less, wherein the surface of said metal substrate has a roughness of Rmax≧0.1 micron, an insulating film provided on a portion of the top surface of said metal substrate leaving a portion of the metal substrate exposed, which insulating film has a thickness of from 3 microns to 10 microns inclusive, wherein said insulating film is made by the plasma CVD method, a semiconductor element mounted on one of said insulating film and an exposed surface of said metal substrate, and at least one of signal film wirings and power film wirings, and passive elements selected from the group consisting of a film resistor and a film capacitor, mounted on said insulating film, said insulating film selected from the group consisting of (1) a single-layer film made of a mixture of silicon oxide and silicon nitride and (2) a multi-layered film having two or more layers laminated one on another and comprising (a) a silicon oxide layer and at least one of (b) a layer made of a mixture of silicon oxide and silicon nitride and (c) a silicon nitride layer, said insulating film having a nitrogen to silicon content of 0.3 to 0.8 and wherein the insulating film has an intrinsic stress measured as a compressive or tensile stress of not more than $8 \times 10^9$ (dyn/cm²), said method comprising the step of removing oxides on the surface of said metal substrate by plasma cleaning in the atmosphere of argon gas, hydrogen gas or a mixture thereof, under the following conditions: board temperature: 350° or less, atmospheric gas pressure: 0.1–30 Torr, discharge output: 0.1–10 w/cm², discharge time: one minute or more, and forming an insulating film on the metal substrate by the plasma CVD method or the CVD method, using a silicon source gas, a nitrogen source gas and an oxygen source as materials, under the following conditions: board temperature: 350° C. or less, gas pressure when forming the film: 0.1 Torr or more and not more than the atmospheric pressure, flow ratio of nitrogen and oxygen source gases to silicon source gas: 0.5–30.

2. A method of manufacturing a semiconductor device comprising a rolled metal substrate made of metal selected from the group consisting of copper and a copper alloy composed of copper as a matrix and at least one other element in an amount of 50 wt % or less, wherein the surface of said metal substrate has a roughness of Rmax≧0.1 micron, an insulating film provided on a portion of the top surface of said metal substrate leaving a portion of the metal substrate exposed, which insulating film has a thickness of from 3 microns to 10 microns inclusive, wherein said insulating film is made by the plasma CVD method, a semiconductor element mounted on one of said insulating film and an exposed surface of said metal substrate, and at least one of signal film wirings and power film wirings, and passive elements selected from the group consisting of a film resistor and a film capacitor, mounted on said insulating film, said insulating film selected from the group consisting of (1) a single-layer film made of a mixture of silicon oxide and silicon nitride and (2) a multi-layered film having two or more layers laminated one on another and comprising (a) a silicon oxide layer and at least one of (b) a layer made of a mixture of silicon oxide and silicon nitride and (c) a silicon nitride layer, said insulating film having a nitrogen to silicon content of 0.3 to 0.8 and wherein the insulating film has an intrinsic stress measured as a compressive or tensile stress of not more than $8 \times 10^9$ (dyn/cm²), said method comprising the steps of removing an oxide layer on the surface of said metal substrate by electrochemical treatment, and forming said insulating film on the surface of said metal substrate by the plasma CVD technique using as material gases a silicon source gas selected from $Si_nH_{2n2}$ (n=1, 2, 3, or 4) and $Si(C_2H_5O)_4$, a nitrogen source gas selected from $NH_3$ and $N_2$, and an oxygen source gas containing one or more selected from $N_2O$, $NO$, $NO_2$, $O_2$ and $O_3$ under the conditions of: metal substrate temperature: 200°–350°, gas pressure at plasma discharge for pretreatment: 0.5 to 30 Torr, applied high-frequency wave output: 0.5–10 w/cm$^2$, discharge time: five minutes or longer, gas pressure when forming film 0.1–5 Torr, gas flow ratio: Fs/(Fn+Fo)$\leq$2 {wherein Fs is an Si source gas flow, Fn is an N source gas flow, and Fe is an 0 source gas flow}, high-frequency wave output density: 0.1–2.0 w/cm$^2$, distance between the substrate and electrodes: 20–40 mm, and substrate temperature: 200°–350° C.

3. A method of manufacturing a semiconductor device comprising a rolled metal substrate made of metal selected from the group consisting of copper and a copper alloy composed of copper as a matrix and at least one other element in an amount of 50 wt % or less, wherein the surface of said metal substrate has a roughness of Rmax$\geq$0.1 micron, an insulating film provided on a portion of the top surface of said metal substrate leaving a portion of the metal substrate exposed, which insulating film has a thickness of from 3 microns to 10 microns inclusive, wherein said insulating film is made by the plasma CVD method, a semiconductor element mounted on one of said insulating film and an exposed surface of said metal substrate, and at least one of signal film wirings and power film wirings, and passive elements selected from the group consisting of a film resistor and a film capacitor, mounted on said insulating film, said insulating film selected from the group consisting of (1) a single-layer film made of a mixture of silicon oxide and silicon nitride and (2) a multi-layered film having two or more layers laminated one on another and comprising (a) a silicon oxide layer and at least one of (b) a layer made of a mixture of silicon oxide and silicon nitride and (c) a silicon nitride layer, said insulating film having a nitrogen to silicon content of 0.3 to 0.8 and wherein the insulating film has an intrinsic stress measured as a compressive or tensile stress of not more than 8×10$^9$ (dyn/cm$^2$), said method comprising the steps of removing an oxide layer on the surface of said metal substrate by electro-chemical treatment, and forming said insulating film on the surface of said metal substrate by the plasma CVD technique using as material gases a silicon source gas selected from Si$_n$H$_{2n+2}$ (n=1, 2, 3 or 4) and Si(C$_2$H$_5$O)$_4$, a nitrogen source gas selected from NH$_3$ and N$_2$, and an oxygen source gas containing one or more selected from N$_2$O, NO, NO$_2$O$_2$ and O$_3$ under the conditions of: metal substrate temperature: 350° C. or less, gas pressure at plasma discharge for pretreatment: 0.1 to 30 Torr, applied high-frequency wave output: 0.1–10 w/cm$^2$, discharge time: one minute or longer, gas pressure when forming film: 0.1–5 Torr, gas flow ratio: 0.1$\leq$2 {wherein Fs is an Si source gas flows, Fn is an N source gas flow, and Fe is an O source gas flow}, high-frequency wave output density: 0.1–2.0 w/cm$^2$, distance between the substrate and electrodes: 10–40 mm, and substrate temperature: 350° C. or less.

4. A method of manufacturing the semiconductor device as in claims 1, 2 or 3, wherein said insulating film contains hydrogen, the amount of said hydrogen satisfying at least one of the following formulas (1) and (2) in terms of the absorption peak by infrared absorption spectrum, $$0.001 \leq I11/IM1 \leq 0.3 \quad (1)$$

$$0.01 \leq I21IM1 \leq 1.5 \quad (2)$$

wherein, IM1=max (IO1, IN1), greater one of IO1 and IN1: I11: maximum absorption height by Si—H bond in a wave number range of 2150–2350 cm$^{-1}$ I21: maximum absorption height by Si—OH bond in a wave number range of 860–980 cm$^{-1}$ IO1: maximum absorption height by Si—O bond in a wave number range of 1020–1200 cm$^{-1}$ IN1: maximum absorption height by Si—N bond in a wave number range of 840–920 cm$^{-1}$.

5. A method of manufacturing the semiconductor device as in claims 1, 2 or 3 wherein said semiconductor device thus produced comprises a rolled metal substrate made of a metal selected from the group consisting of copper and a copper alloy composed of copper as a matrix and at least one other element in an amount of 50 wt % or less, wherein the surface of said metal substrate has a roughness of Rmax$\geq$0.1 micron, an insulating film provided on a portion of the top surface of said metal substrate leaving a portion of the metal substrate exposed, which insulating film has a thickness of from 3 microns to 10 microns inclusive, wherein said insulating film is made by the plasma CVD method, a semiconductor element mounted on one of said insulating film and on an exposed surface of said metal substrate, and at least one of signal film wiring and power film wirings, and passive elements selected from the group consisting of film resistors and film capacitors, mounted on said insulating film, said insulating film having at least two layers laminated one on another and comprising (a) a silicon oxide layer and (b) a layer made of a mixture of silicon oxide and silicon nitride, the nitrogen content of the latter layer continuously increasing or decreasing in the direction of thickness of said film so that the highest nitrogen content will be 0.3 or more in terms of atomic ratio to silicon.

6. A method of manufacturing the semiconductor device as in claims 1, 2 or 3 wherein said semiconductor device thus produced comprises a rolled metal substrate made of metal selected from the group consisting of copper and a copper alloy composed of copper as a matrix and at least one other element in an amount of 50 wt % or less, wherein the surface of said metal substrate has a roughness of Rmax24 0.1 micron, one of a single-layer metal film and a multilayer metal film on a portion of the top surface of said metal substrate leaving a portion of the metal substrate exposed, which metal film is made of at least one element selected from the group consisting of Ni, Cr, Al, Ti, Au, Pt and Ag or a multi-layered film thereof or an alloy film made of at least two elements selected from said group, an insulating film provided on the top surface of said metal film and having a thickness of from 3 microns to 10 microns inclusive, wherein said insulating film is made by the plasma CVD method, a semiconductor element mounted on one of said insulating film and an exposed surface of said metal substrate, and at least one of signal film wirings, power film wirings, and passive elements selected from the group consisting of a film resistor and a film capacitor, mounted on said insulating film, said insulating film selected from the group consisting of (1) a single-layer film made of a mixture of silicon oxide and silicon nitride and (2) a multilayered film having two or more layers laminated one on another and comprising (a) a silicon oxide layer and at least one of (b) a layer made of a mixture of silicon oxide and silicon nitride and (c) a silicon nitride layer, said insulating film having a nitrogen to silicon content of 0.3 to 0.8 and wherein the insulating film has an intrinsic stress measured as a compressive or tensile stress of not more than 8×10$^9$ dyn.

* * * * *